United States Patent
Wang (10) Patent No.: US 9,246,085 B1
(45) Date of Patent: Jan. 26, 2016

(54) SHAPING RERAM CONDUCTIVE FILAMENTS BY CONTROLLING GRAIN-BOUNDARY DENSITY

(71) Applicants: Intermolecular Inc., San Jose, CA (US); Kabushiki Kaisha Toshiba, Tokyo (JP); SanDisk 3D LLC, Milpitas, CA (US)

(72) Inventor: Yun Wang, San Jose, CA (US)

(73) Assignees: Intermolecular, Inc., San Jose, CA (US); Kabushiki Kaisha Toshiba, Tokyo (JP); SanDisk 3D LLC, Milpitas, CA (US)

(*) Notice: Subject to any disclaimer, the term of this patent is extended or adjusted under 35 U.S.C. 154(b) by 0 days.

(21) Appl. No.: 14/338,949

(22) Filed: Jul. 23, 2014

(51) Int. Cl.
  *H01L 27/24* (2006.01)
  *H01L 45/00* (2006.01)

(52) U.S. Cl.
  CPC .............. *H01L 45/08* (2013.01); *H01L 45/085* (2013.01); *H01L 45/165* (2013.01); *H01L 45/1658* (2013.01); *H01L 27/24* (2013.01); *H01L 27/2409* (2013.01); *H01L 45/04* (2013.01); *H01L 45/1246* (2013.01); *H01L 45/1608* (2013.01)

(58) Field of Classification Search
  CPC ..... H01L 27/24; H01L 27/2409; H01L 45/04; H01L 45/1246; H01L 45/1608
  See application file for complete search history.

(56) References Cited

U.S. PATENT DOCUMENTS

| | | | | |
|---|---|---|---|---|
| 4,959,262 A * | 9/1990 | Charles et al. | ............... | 428/329 |
| 5,527,739 A * | 6/1996 | Parrillo | ............... | H01L 23/5226 257/E23.145 |
| 6,365,496 B1 * | 4/2002 | Sidhwa | ............. | H01L 21/02063 257/E21.165 |
| 7,400,522 B2 * | 7/2008 | Toda et al. | ................... | 365/148 |
| 7,432,141 B2 | 10/2008 | Gu | | |
| 7,655,950 B2 * | 2/2010 | Sato | ..................... | B23K 26/063 257/59 |
| 7,678,496 B2 * | 3/2010 | Sakai | ..................... | H01M 4/68 429/129 |
| 7,811,905 B2 * | 10/2010 | Kim | ........................ | H01L 45/04 257/1 |
| 7,907,436 B2 * | 3/2011 | Maejima et al. | ............... | 365/148 |
| 7,927,929 B2 * | 4/2011 | Chen | ..................... | H01L 21/268 257/59 |
| 8,053,776 B2 * | 11/2011 | Ohashi | ........................... | 257/64 |
| 8,119,469 B2 * | 2/2012 | Kim | ................ | H01L 21/02532 438/151 |
| 8,124,568 B2 * | 2/2012 | Hayashi et al. | ............... | 505/234 |
| 8,435,831 B2 | 5/2013 | Sekar | | |
| 8,450,715 B2 | 5/2013 | Takano | | |
| 8,692,223 B2 * | 4/2014 | Moon et al. | ........................ | 257/4 |
| 2001/0003378 A1 * | 6/2001 | Harada et al. | ................. | 257/726 |
| 2006/0189052 A1 * | 8/2006 | Kim | ............................. | 438/166 |
| 2006/0202208 A1 * | 9/2006 | Tsukuda | ............... | C30B 15/007 257/75 |
| 2008/0135785 A1 * | 6/2008 | Takaoka | .................. | C30B 13/24 250/492.22 |

(Continued)

OTHER PUBLICATIONS

Yu, S., et al; On the Stochastic Nature of Resistive Switching in Metal Oxide RRAM Physical Modeling Monte Carlo Simulation and Experimental Characterization; Jan. 1, 2011; IEEE; IEEE 978145770505211.

*Primary Examiner* — Ida M Soward (57) ABSTRACT

Filament size and shape in a ReRAM stack can be controlled by doping layers of a variable-resistance stack to change the crystallization temperature. This changes the density of the grain boundaries that form during annealing and provide minimal-resistance paths for the migration of charged defects. Hf, Zr, or Ti decreases the crystallization temperature and narrows the filament, while Si or N increases the crystallization temperature and widens the filament. Tapered filaments are of interest: The narrow tip requires little energy to break and re-form, enabling the cell to operate at low power, yet the wider body and base are insensitive to entropic behavior of small numbers of defects, enabling the cell to retain data for long periods.

9 Claims, 5 Drawing Sheets

(56) References Cited

U.S. PATENT DOCUMENTS

| | | | |
|---|---|---|---|
| 2008/0241641 A1* | 10/2008 | Kurita et al. | 429/40 |
| 2010/0288995 A1 | 11/2010 | Ozawa | |
| 2012/0012807 A1 | 1/2012 | Yamaguchi | |
| 2012/0153249 A1 | 6/2012 | Zhang | |
| 2012/0267598 A1* | 10/2012 | Sakotsubo et al. | 257/4 |
| 2013/0221311 A1 | 8/2013 | Sekar | |
| 2013/0240825 A1* | 9/2013 | Fujii | H01L 45/085 257/4 |
| 2013/0328006 A1* | 12/2013 | Hwang et al. | 257/2 |
| 2015/0028281 A1* | 1/2015 | Chen et al. | 257/4 |

* cited by examiner

SHAPING RERAM CONDUCTIVE FILAMENTS BY CONTROLLING GRAIN-BOUNDARY DENSITY

BACKGROUND

Related fields include semiconductor devices and their fabrication; in particular, thin-film components of resistive-switching non-volatile memory (ReRAM).

Nonvolatile memory elements are used in computers and other devices requiring persistent data storage (e.g., cameras, music players). Some traditional nonvolatile memory technologies (e.g., EEPROM, NAND flash) have proven difficult to scale down to smaller or higher-density configurations. Therefore, a need has developed for alternative nonvolatile memory technologies that can be scaled down successfully in terms of performance, reliability, and cost.

In resistive-switching-based nonvolatile memory, each individual cell includes a variable resistor. It can be put into either of at least two states (e.g., a low-resistance state and a high-resistance state), where it will stay until receiving a signal input that changes it to the other state (a "write," "set," or "reset" signal). The resistive state of the variable resistor corresponds to a bit value; e.g., the low-resistance state may represent logic "1" and the high-resistance state may represent logic "0". The cell is written by applying a signal that changes the resistance of the variable resistor, and is read by sensing its present resistance without changing it.

Many ReRAM devices change resistance by creating and destroying, or lengthening and shortening, one or more conductive paths through a variable-resistance layer or stack while the bulk material remains substantially static (e.g., it does not change phase). The bulk material is often a highly insulating dielectric. The conductive paths (also known as "percolation paths") are formed when an electric field organizes conductive or charged defects or impurities into a filament stretching from one interface to the other, with sufficient defect density that charge carriers can easily traverse the layer by tunneling from defect to defect. To return the variable resistor to the high-resistive state, it is often not necessary to destroy the entire filament, but only to introduce a gap too wide for tunneling somewhere along the filament's length. Some of the types of defects that have been used include metal clusters and oxygen (or nitrogen) vacancies.

Preferably, write and read operations should require as little power as possible, both to conserve energy and to avoid generating waste heat. Preferably, the different resistance states should be easily distinguishable by sensing with a low current. Repeatability and cell-to-cell consistency of the resistance values contribute to certainty in sensing the resistive state; variations from cycle to cycle or cell to cell put "error bars" around the resistance values and make them less distinguishable.

Preferably, the different resistance states should be stable over long periods (e.g., years). Therefore, there should only be significant movement of defects in the cell when a write signal is applied. If defects migrate in an uncontrolled manner between write signals, even very slowly, the written data will eventually be lost.

So far, meeting all these goals in a single design has been challenging. Therefore, a need exists for ReRAM cell designs and fabrication methods that enable low-power operation, reduce the potential for reading errors by improving cycle-to-cycle repeatability and cell-to-cell consistency, and preserve stable resistance states over long time periods.

SUMMARY

The following summary presents some concepts in a simplified form as an introduction to the detailed description that follows. It does not necessarily identify key or critical elements and is not intended to reflect a scope of invention.

The local size, and thereby the shape, of a conductive filament in a polycrystalline variable-resistance component of a ReRAM cell can be modified by controlling the local grain size and grain-boundary density. The higher the grain-boundary density (i.e., the smaller the grains), the wider the conductive filament. This technique can produce tapered filament shapes that are easy to breaking and re-form in a narrow region (for low-power operation, cycle-to-cycle repeatability, and cell-to-cell consistency) and are stable over time in a wider region (for long-term data retention).

Embodiments of a resistance-switchable device may include a first layer (first electrode) formed over a substrate, a second layer (second electrode) formed over the first electrode, and a variable-resistance stack ("VR stack") between the first electrode and the second electrode. The VR stack may include a small-grain VR layer with high grain-boundary density, a large-grain VR layer with low grain-boundary density, and a medium-grain layer between the small-grain VR layer and the large-grain VR layer. In some embodiments, one of the electrodes may be a source electrode and the small-grain VR layer may be the nearest VR layer to the source electrode.

In some embodiments, the VR layers may be made of different materials. Alternatively, two or more of the VR layers may be made of the same host material (e.g., a metal oxide, nitride, or oxynitride), with different doping to modulate the size of the polycrystalline grains that form after annealing by modulating the crystallization temperature of the material. The dopant composition, the amount of doping, or both may differ between the VR layers. In some embodiments, one of the VR layers may be undoped. For example, the medium-grain VR layer may be undoped, the small-grain layer may be doped with hafnium (Hf), tantalum (Ta), titanium (Ti), or zirconium (Zr), and the large-grain layer may be doped with silicon (Si) or nitrogen (N). Optionally, one or more intervening layers may be between the VR stack and either or both electrodes.

Some embodiments of the device have only two VR layers with different grain sizes produced by doping at least one of the layers to modify its crystallization temperature.

Embodiments of a method for fabricating the resistance-switchable device may include forming a first layer (a first electrode) over a substrate; forming a second layer (a high-crystallization-temperature variable-resistance ("HXT-VR") layer) over the first electrode; forming a third layer (a medium-crystallization-temperature variable-resistance ("MXT-VR") layer) over the HXT-VR layer; forming a fourth layer (a low-crystallization-temperature variable-resistance ("LXT-VR") layer) over the MXT-VR layer; forming a second layer (a second electrode) over the LXT-VR layer; and annealing the substrate at a temperature of at least the high crystallization temperature ("HXT") before or after forming the second electrode.

In some embodiments, forming one or more of the VR layers may include doping. The doping may include ion implantation; co-deposition during PVD, CVD, or ALD; or inserting a dopant layer during PVD, CVD, or ALD. The dopant(s) may include Hf, Ta, Ti, Zr, Si, or N. In some embodiments, one or more of the VR layers may be undoped. Optionally, one or more intervening layers may be formed before or after forming the VR stack. In some embodiments, the duration of the annealing may be long enough to crystallize at least 30% of the HXT-VR layer.

Some embodiments of the method form only two VR layers with different doping conditions to vary the crystallization temperature.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

As used herein, the following terms shall have the following meanings unless associated text or context indicates an exception:

"A," "an," and singular nouns: May include plural variations, e.g., "a layer" may mean "one or more layers."

"About" or "approximately": Within ±10% variation.

"Above" and "over": Either directly contacting or separated by intervening elements; may conform to an underlying 3D structure.

"Amorphous": Exhibits less than 30% crystallinity as measured by a technique such as x-ray diffraction (XRD).

"Between" (range of values): Both boundary values and any value between the boundaries can be within the scope.

"Conductive:" Resistivity<1e-5 Ω·m at the intended operating temperature.

"Crystalline": Exhibits at least 30% crystallinity as measured by a technique such as x-ray diffraction (XRD).

"Dopant": A minor constituent (generally <30 atomic %) intentionally added (not a residue or impurity from imperfect constituents or processes). May or may not be electrically active.

"Film" and "layer": Interchangeably describe a portion of a stack; may include multiple sub-layers (e.g., a nanolaminate).

"First," "second," and other ordinals: For differentiation only, rather than imposing any specific spatial or temporal order.

"In situ": Without an intervening vacuum break or other exposure to an uncontrolled environment; in the same process chamber as a previous process, or in another chamber with vacuum access to the chamber used for the previous process (e.g., in a multi-chamber cluster tool).

"Insulating" or "dielectric": Resistivity>1e8 Ω·m at the intended operating temperature.

"Low", "medium," and "high" crystallization temperatures are relative terms for each stack. For example, the "low" crystallization temperature may be at least 10 C lower, and the "high" crystallization temperature may be at least 10 C higher, than the "medium" crystallization temperature.

"On": Directly contacting; may conform to an underlying 3D structure.

"Operable" (for a specific purpose): Would satisfactorily fulfill that purpose given suitable connections, signals, or other external conditions.

"Or" in a list: Any, all, or any subset of list may be used.

"Oxide" (of an element): May include additional components besides the element and oxygen, including but not limited to a dopant or alloy.

"Substantially": Within up to ±5% variation.

"Substrate": A wafer or any other workpiece on which formation or treatment of material layers is desired. Non-limiting examples include silicon, germanium, silica, sapphire, zinc oxide, SiC, AlN, GaN, Spinel, or silicon on oxide, silicon carbide on oxide.

"Surface": Boundary between the ambient environment and a feature of the substrate.

"Variable resistance" (in a ReRAM resistive-switching layer): Resistance that is reversibly switched between at least two stable states by "write" signals, but remains approximately constant in response to "read" signals.

Figure 1A:
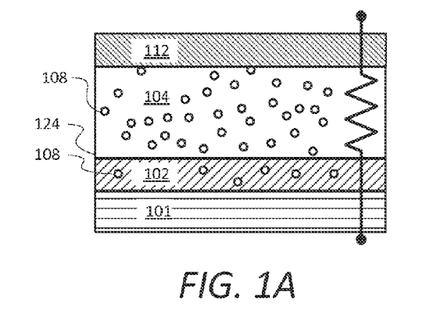
FIGS. 1A-B conceptually illustrate initial filament formation in a variable-resistance layer of a ReRAM cell.
Figure 1B:
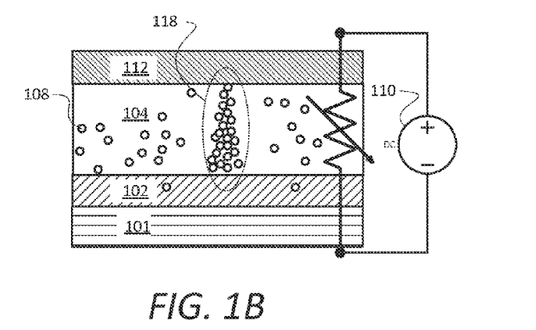

FIGS. 1A and 1B conceptually illustrate initial filament formation in a variable-resistance layer of a ReRAM cell. FIG. 1A is a schematic representation of layers in a ReRAM cell before any filaments are formed. Although some ReRAM cells include additional layers, the illustration is simplified to show only substrate 101 (which may include other structures and layers), electrodes 102 and 112, and VR layer 104 between the electrodes. Electrodes 102 and 112 are generally conductive layers, although the conductivity may sometimes be less than that of typical electrodes in other devices. In such embodiments, a current-limiting embedded resistor may be integrated with one or both of the electrodes to prevent over-forming.

In this example, first electrode 102 is a reactive or "source" electrode that may act as a source or reservoir of electrically active defects 108. In this example, second electrode 112 is an inert electrode that does not react with, or exchange material or defects with, VR layer 104. In some embodiments, the first electrode may be inert and the second electrode may be reactive. Inert electrodes may be made of inert materials (e.g., noble metals) or may be rendered inert by a barrier layer between the electrode and the VR layer (e.g., polycrystalline silicon with a silicon oxide barrier layer). Reactive electrodes may be made of any sufficiently conductive material that provides the desired mobile defects; for example, titanium nitride for oxygen vacancies, or silver or copper for metal ions.

Defects 108 may travel through "reactive interface" 124 between reactive electrode 102 and VR layer 104, e.g., when mobilized by an electric field from an applied voltage. Defects 108 may be, by way of non-limiting example, metal ions, vacancies (e.g., oxygen vacancies), interstitial atoms, or stress-induced lattice dislocations. Either alternatively or in addition, VR layer 104 may be formed with defects 108. If sufficient defects to form a filament are available in VR layer 104, both electrodes may be inert electrodes. VR layer 104 may be a high-k or low-k dielectric, a dielectric stack or, in some embodiments, a low-conductivity semiconductor. With no filament formed, the position, number, and distribution of defects 108 is not conducive to electron tunneling between first electrode 102 and second electrode 112.

In FIG. 1B, a voltage source 110 applies a forming-voltage pulse to electrodes 102 and 112, mobilizing defects 108 to form a filament 118 in VR layer 104. The defects may be gathered from an original distribution throughout the bulk of VR layer 104, or they may enter VR layer 104 from a reactive electrode 102 (or some other type of defect-access layer), or they may be created in VR layer 104 by interaction of the electric field with another feature of the material, or any combination. In filament 118, the defects are sufficiently close together that electrons may tunnel from defect to defect through the VR layer from one electrode to the other. In some embodiments, the forming operation includes heating to enhance mobility of the defects within ReRAM cell 100.

In general, the forming operation is a one-time fabrication step that converts the original dielectric of VR layer 104 to a variable resistive material. Afterward, in operating the ReRAM cell, a lesser "reset" voltage may be applied to break at least the weak part of the filament and raise the resistance of the VR layer to a high resistance state (HRS); a lesser "set" voltage may be applied to restore the broken part of the filament and lower the resistance of the VR layer to a low resistance state (LRS); and an even lesser "read" voltage may be applied to sense the resistance of the VR layer without changing it. Moving, creating, or destroying the defects requires energy, but leaving them in place does not; therefore, the VR layer is non-volatile, retaining its written LRS or HRS state if the cell is unpowered. In some embodiments, the resistance values of the HRS and LRS are repeatable within ±20% or less.

Figure 2:
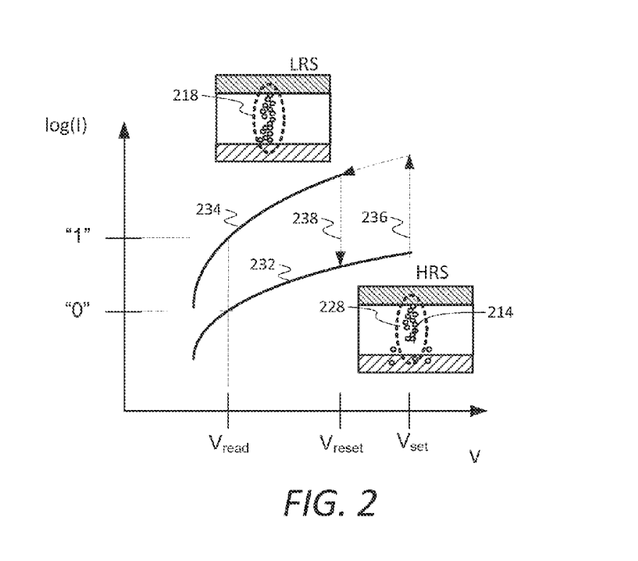
FIG. 2 is an example I-V plot for reading and writing a ReRAM cell.

FIG. 2 is an example I-V plot for reading and writing a ReRAM cell. Specifically, FIG. 2 is a plot of current passing through a unipolar ReRAM cell as a function of applied voltage according to some embodiments. The cell's response when the VR layer is in its HRS, with a broken filament 228 ending at break-point 214, is plotted as curve 232. The cell's response when the VR layer is in its LRS, with a restored filament 218 connecting the two electrodes, is plotted as curve 234.

With two possible resistive states, the cell can store one bit of data. Some ReRAM cells may have three or more resistance states to enable multi-bit storage in a single cell. To change the stored value, a write voltage $V_{SET}$ or $V_{RESET}$ is applied to the cell. $V_{RESET}$ breaks complete filament 218 at break-point 214 into broken filament 228, and $V_{SET}$ restores broken filament 228 to a complete filament 218. In a unipolar cell as illustrated here, $V_{SET}$ and $V_{RESET}$ have the same polarity. In a bipolar cell, $V_{SET}$ and $V_{RESET}$ have opposite polarities.

To read the stored value, a sensing or "read" voltage $V_{READ}$ is applied across the cell and the output current is measured. Because of Ohm's law, V=IR, for a given $V_{READ}$ the output current I depends on the cell resistance R, which depends on whether the VR layer is in its LRS or its HRS. In the illustrated example, the LRS corresponds to logic "1" and the HRS corresponds to logic "0," although some embodiments may reverse the correspondences.

ReRAM cells may be switched between LRS and HRS (rewritten) many times. Between switching events, any number of read operations may be performed. In some embodiments, the set voltage ($V_{SET}$) is between about 100 mV and 10V; e.g., between about 500 mV and 5V. The length of set voltage pulses ($t_{SET}$) may be less than about 100 milliseconds, less than about 5 milliseconds, or less than about 100 nanoseconds. The read voltage ($V_{READ}$) may be between about 1/10 and 1/2 of $V_{SET}$. In some embodiments, the currents sensed during read operations are greater than about 1 mA, or even greater than about 5 mA to allow for a fast detection of the logic state by small sense amplifiers. The length of a read voltage pulse ($t_{READ}$) may be comparable to the length of a set voltage pulse ($t_{SET}$) or may be shorter. ReRAM cells preferably can switch between LRS and HRS at least about $10^3$ times or, more desirably at least about $10^7$ times without failure. They preferably retain their data for at least about 5 years or, more desirably, at least about 10 years at temperatures up to 85° C. under constant application of $V_{READ}$. In some embodiments, low current leakage, such as less than about 40 A/cm² measured at 0.5 V per 20 Å of oxide thickness in HRS, may also be preferred.

In a homogeneous VR layer, break-point 214 may be in a different place in each cell, and may also be in a different place after every cycle of the same cell. Inconsistency and lack of repeatability in break-point 214 cause similar inconsistencies and lack of repeatability in HRS and LRS resistances, which may cause uncertainty in reading data stored in the cells.

Electrodes may be made from conductive materials, such as n-doped polysilicon, p-doped polysilicon, titanium nitride, ruthenium, iridium, platinum, and tantalum nitride. Electrodes may be less than about 100 nm thick, less than about 50 nm thick, or even less than about 10 nm thick. Even thinner electrodes may be made by ALD. Either or both electrodes may be made of an inert material that does not react with neighboring layers.

In some embodiments, one of the electrodes may be made of a reactive material to act as a source, reservoir, or sink for defects in the variable resistance layer. Defects may travel through the interface between the reactive electrode and the VR layer during forming, set, or reset operations. For example, titanium nitride is an oxygen-scavenging material and can create oxygen vacancies in a neighboring oxide layer.

The VR layer may be fabricated from a dielectric material, such as a metal oxide material or other similar material that can be reversibly switched between two or more stable resistive states. In some embodiments, the VR layer is fabricated from a high bandgap material, e.g., a material that has a bandgap of at least about 4 electron volts (eV). Some examples of such materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The high bandgap materials may improve data retention in ReRAM cell 300 and reduce the current leakage since the amount of trapped charge in these materials is less than a lower bandgap material. Furthermore, the high bandgap materials create a large barrier height that the carriers have to cross during the read, set, and reset operations. Other suitable materials for the VR layer include titanium oxide ($TiO_x$), nickel oxide ($NiO_x$), and cerium oxide ($CeO_x$). Furthermore, semiconducting metal oxides (p-type or n-type), such as zinc oxides ($Zn_xO_y$), copper oxides ($Cu_xO_y$), and their nonstoichiometric and doped variants can be used for the VR layer.

The VR layer may have a thickness of between about 1 nm and about 100 nm, such as between about 2 nm and 20 nm or between about 5 nm and 10 nm. Thinner VR layers may be deposited using ALD, while thicker VR layers may be deposited using ALD as well as physical vapor deposition (PVD) and, in some embodiments, chemical vapor deposition (CVD).

Figure 3A:
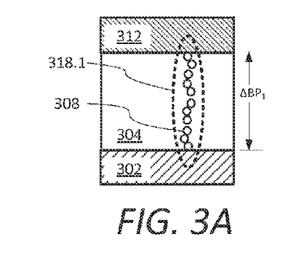
FIGS. 3A-C illustrate example filaments in a VR layer.
Figure 3B:
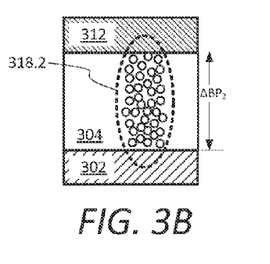
Figure 3C:
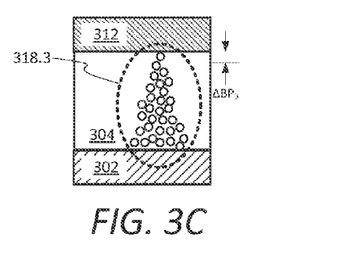

FIGS. 3A-C illustrate example filaments in a VR layer. Each illustrated ReRAM cell has a VR 304 of a homogeneous host material between electrode 302 and electrode 304. Each of the cells is shown in a low-resistance state with a completely formed filament of defects 308.

In FIG. 3A, filament 318.1 is narrow and includes a small number of defects. It can be broken or re-formed by moving, creating, or destroying only a few defects 308, which takes only a small amount of energy. This allows the cell to operate at very low power. However, this advantage in operational power is a disadvantage in data retention. Because so few defects need to be modified to change the resistance state, uncontrolled creation, destruction, or migration of defects under heat or over time have an appreciable probability of causing a spontaneous state change; i.e., an unwanted write event. Moreover, the thickness of filament 318.1 is fairly uniform; since VR layer 308 is homogeneous, the filament break-point may be anywhere. Therefore the break-point uncertainty $\Delta BP_1$ is the entire length of filament 318.1.

In FIG. 3B, filament 318.2 is wide and includes a large number of defects. Its data retention is probably very good, because one or two defects joining or leaving the filament would be highly unlikely to change the resistance state. On the other hand, precisely because a resistance change would require the modification of a large number of defects, this cell will need fairly high power to operate. Again, though, the roughly uniform filament thickness and the homogeneity of the VR layer 308 cause all possible break-point locations to be equally likely. Therefore the break-point uncertainty $\Delta BP_2$ is the entire length of filament 318.2.

In FIG. 3C, filament 318.3 is tapered from a wide base near electrode 302 to a narrow tip near electrode 312. Because most of tapered filament 318.3 is fairly wide, the resistance state is expected to be more tolerant of entropic modification of isolated defects than narrow filament 318.1, indicating that the data retention will probably be better in the conical filament. However, because the tip of tapered filament 318.3 is the narrowest point, it is also the weakest point and therefore a predictably most-probable location for a break-point. Breaking or re-forming the narrow tip of tapered filament 318.3 requires less energy than breaking or re-forming the thickness of thick filament 318.2, so the cell with the tapered filament is expected to operate at fairly low power. Finally, the high probability of the tapered filament's breaking at the tip rather than anywhere else reduces the break-point uncertainty $\Delta BP_3$ to a small fraction of the filament's length.

Figure 4A:
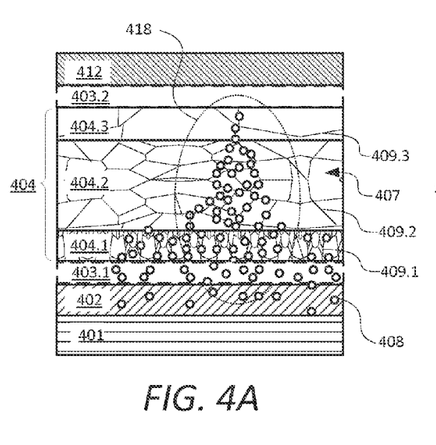
FIGS. 4A and 4B are conceptual diagrams of a ReRAM cell designed to form a tapered filament.
Figure 4B:
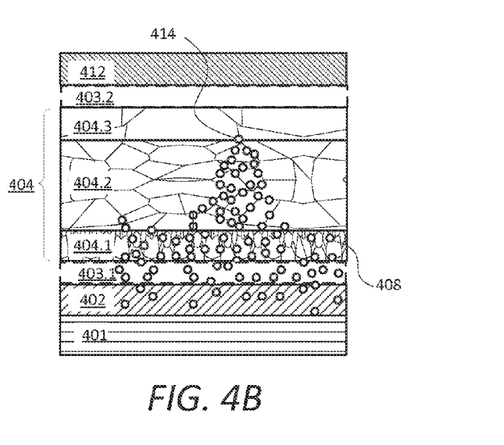

FIGS. 4A and 4B are conceptual diagrams of a ReRAM cell designed to form a tapered filament. FIG. 4A shows the cell in a low-resistance state with a complete filament 418. Substrate 401 may include other layers or structures underlying those shown. For example, substrate 401 may include selectors, current steering devices, word-lines, bit-lines, other interconnects, or other devices independent of, or peripheral to, the illustrated structures. On substrate 401, a ReRAM cell includes a VR stack 404 between first electrode 402 and second electrode 412. In some embodiments, the cell may also include one or more intervening layers between one or both of the electrodes and the switching stack, illustrated as optional layers 403.1 and 403.2. The intervening layer(s) may include a barrier layer, an adhesion layer, a coupling layer, a current-limiting layer, or other functional layers known in the ReRAM art.

VR stack 404 includes multiple layers of switchable material (e.g., a metal oxide, nitride, or oxynitride) with different polycrystalline morphologies. Illustrated are small-grain VR layer 404.1, medium-grain layer 404.2, and large-grain VR layer 404.3. The fill patterns in the illustrations are not meant to be realistic—polycrystals are more random than they are shown—but merely to differentiate between layers with different properties.

Polycrystalline materials contain numerous crystallites ("grains") 407 of different sizes and orientations, grown from different nuclei. The distribution of orientations may be random, or may be directed by conditions during growth and processing. Grain boundaries (e.g., 409.2 in medium-grain layer 404.2) are the interfaces between grains 407, where the lattices of the neighboring grains generally are mismatched. In a dielectric crystal, the grain boundaries are significantly more conductive than the bodies of the grains. Charge carriers or charged defects 408, when impelled to migrate (e.g., by an electric field or temperature gradient) will preferentially travel along any available grain boundaries because of the higher conductivity.

The smaller the grain size in a polycrystalline material, the higher the grain boundary density. Dense grain boundaries provide many closely-spaced alternative paths for migrating charge carriers or charged defects. In the illustrated example, filament-forming defects 408 originate in bottom electrode 402 (a "source electrode" made of a reactive material such as titanium nitride (TiN). The other electrode 412 may be an inert electrode made of a noble metal or a less-reactive electrode made of a binary or ternary nitride of a heavier metal (e.g., Ta, Mo, W), which does not provide a source of defects. Preferably, any intervening layers 403.1 between the source electrode 402 and the VR stack 404 are defect-permeable.

Actuated by a forming pulse or a "set" signal, defects 408 may migrate from source electrode 402 into small-grain VR layer 404.1 at many locations through the abundant, closely spaced grain boundaries 409.1. In medium-grain VR layer 404.2, there are fewer path choices because the grain boundaries 409.2 are less dense. This causes filament 418 to taper as the defect distribution becomes more concentrated into a path of least resistance. When the narrower group of migrating defects reaches large-grain VR layer 404.3, there may be only a few of the low-density grain boundaries 409.3 connected to the ends of the defect-occupied paths. This causes filament 418 to taper even more so that the tip near the top interface of large-grain VR layer 404.3.

FIG. 4B shows the cell in a high-resistance state with the filament broken at break-point 414. The tip of the taper in large-grain VR layer 404.3 is a natural weak point where the filament is slender. Not many defects 408 need to be moved or re-absorbed to break filament 418 at or near breakpoint 414. By contrast, the wider parts of the filament in medium-grain VR layer 404.2 and small-grain VR layer 404.1 take much more energy to break because of the larger number of defects in the wider parts of the taper. Thus, the filament break-point is likely to be repeatable on the order of the thickness of large-grain VR layer 404.3, which is controllable by the fabrication process.

One way to control relative grain size in multiple layers within the same stack is to use materials with different crystallization temperatures. These can be different materials, or a single host material can be doped in localized regions to raise or lower the local crystallization temperature. For ease of description, the examples have three layers: a low-crystallization-temperature VR (LXT-VR) layer, a medium-crystallization-temperature VR (MXT-VR) layer, and a high-crystallization (HXT-VR) layer. However, any VR stack with two or more layers crystallizing at different temperatures may be within the scope.

Figure 5:
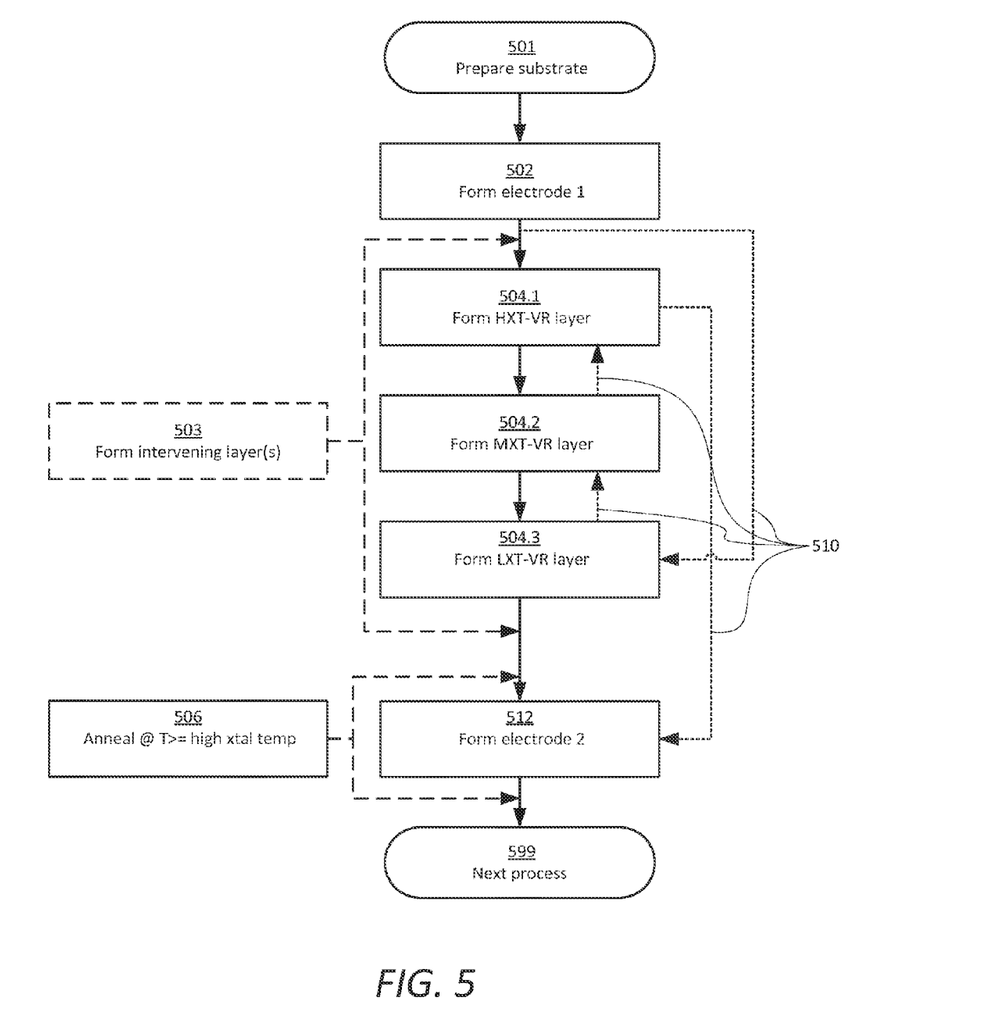
FIG. 5 is a flowchart of an example process for fabricating a ReRAM cell designed to form a tapered filament.

FIG. 5 is a flowchart of an example process for fabricating a ReRAM cell designed to form a tapered filament. Step 501 of preparing the substrate may include cleaning, degassing, other treatments, or the formation of layers and structures that precede those formed by this process. Step 502 of forming a first electrode over a substrate may include any suitable method for the selected material, which in some embodiments may include without limitation PVD, CVD, ALD, plasma-enhanced or UV-assisted variants of CVD or ALD, electrochemical deposition, electroless deposition, evaporation, or the like.

Step 504.1 of forming the HXT-VR layer is followed by step 504.2 of forming the MXT-VR layer, and then by step 504.3 of forming the LXT-VR layer. Alternatively, the VR layers may be formed in the order indicated by dotted-line connectors 510: first the LXT-VR layer, then the MXT-VR layer, then the HXT-VR layer. In some embodiments, the order may be selected to position the HXT-VR layer closest to a source electrode and the LXT-VR layer closest to an inert or less-reactive electrode.

All three VR layers may be differently doped versions of the same host material. The host material may be, for example, a metal oxide, a metal nitride, or a metal oxynitride. Two of the layers may be doped and one may be undoped, or all three of the layers may be doped. For example, the MXT-VR layer may be undoped, the LXT-VR layer may be doped with an XT-decreasing dopant such as Hf, Ta, Ti or Zr, and the HXT-VR layer may be doped with an XT-increasing dopant such as Si or N. Alternatively, the LXT-VR layer may be undoped, the MXT-VR layer may be doped with an XT-increasing dopant, and the HXT-VR layer may be more heavily doped with the XT-increasing dopant. As another alternative, the HXT-VR layer may be undoped, the MXT-VR layer may be doped with an XT-decreasing dopant, and the HXT-VR layer may be more heavily doped with the XT-decreasing dopant. Any variation of materials or dopants that result in an MXT-VR layer between an LXT-VR layer and an HXT-VR layer can be within the scope. The differently doped VR layers may have discrete interfaces with each other, created by abruptly starting or stopping the doping, or gradient interfaces created by gradually increasing or decreasing the dopant concentration.

In some embodiments, the doping may be combined with deposition of the host material by co-deposition methods such as co-sputtering (PVD) or mixing precursors (CVD or ALD). Alternatively, the doping may include pausing the deposition of the host material one or more times to deposit a thin layer (e.g., 3 nm thick) of dopant before continuing to deposit the host material. Annealing may be used to interdiffuse the dopant layers and host layers. As another alternative, the dopant(s) may be added by ion implantation after the host layers are partially or fully formed.

Step 512 of forming a second electrode follows the formation of the three VR layers 504.1-504.3. Step 506 of annealing the substrate at a temperature greater than or equal to $XT_H$ may be done either before or after the forming of the second electrode. Annealing 506 may continue for a sufficiently long duration to crystallize at least 30% of the HXT-VR layer. Optional step 503 of forming an intervening layer (e.g., a barrier layer, an adhesion layer, a coupling layer, a current-limiting layer, or the like) may be inserted before or after the formation of the three VR layers 504.1-504.3. Afterward, next step 599 may commence.

FIGS. 6A-D conceptually illustrate the crystallization of LXT, MXT, and HXT layers in the VR stack. For clarity, underlying layers are not shown and are implicit in substrate 601. Overlying layers are also not shown, and may or may not have been formed at this stage. The fill patterns in the illustrations are not meant to be realistic—polycrystals are more random than they are shown—but merely to differentiate between layers with different properties.

Figure 6A:
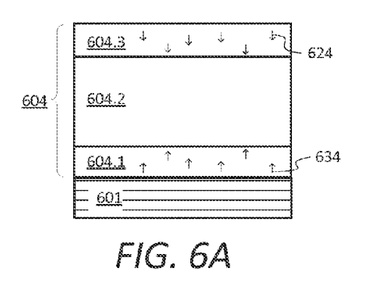
FIGS. 6A-D conceptually illustrate the crystallization of LXT, MXT, and HXT layers in the VR stack.

In FIG. 6A, VR layers 604.1, 604.2, and 604.3 are as-deposited. In this example, the three layers have a common host material, such as a metal oxide, nitride, or oxynitride. LXT-VR layer 604.3 is doped with XT-decreasing dopant, symbolized by "downward" arrows 624. MXT-VR layer 604.2 is undoped. HXT-VR layer 604.1 is doped with XT-increasing dopant, symbolized by "upward" arrows 634. As-deposited, the example layers materials are amorphous with no significant grain boundaries. Some processes involving high-temperature deposition may result in partially crystallized as-deposited films.

Figure 6B:
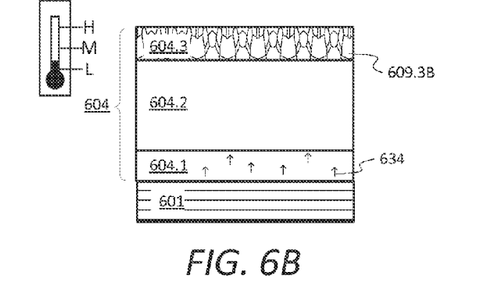

FIG. 6B shows the effect of annealing at a temperature above the crystallization temperature L of LXT-VR layer 604.3 but below the crystallization temperature M of MXT-VR layer 604.3. LXT-VR layer 604.3 forms small crystallites with high-density grain boundaries 609.3B, while MXT-VR layer 604.2 and HXT-VR layer 604.1 do not become significantly more crystalline than they were as-deposited.

Figure 6C:
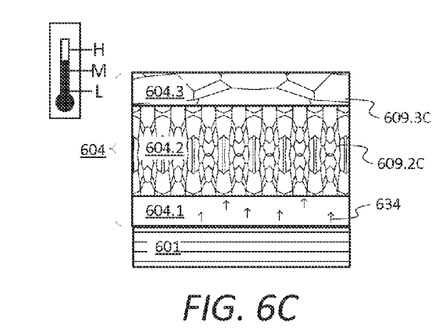

FIG. 6C shows the effect of annealing at a temperature above the crystallization temperature M of MXT-VR layer 604.2 but below the crystallization temperature H of HXT-VR layer 604.1. LXT-VR layer 604.3 forms medium crystallites with medium-density grain boundaries 609.3C and MXT-VR layer 604.2 forms small crystallites with high-density grain boundaries 609.2C, while HXT-VR layer 604.1 does not become significantly more crystalline than it was as-deposited.

Figure 6D:
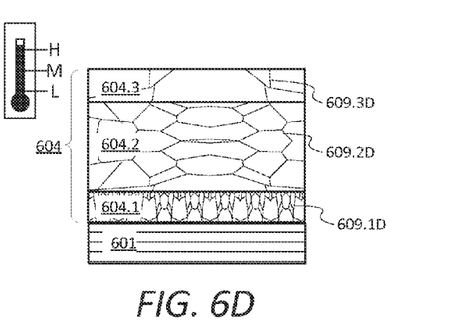

FIG. 6D shows the effect of annealing at a temperature above the crystallization temperature H of HXT-VR layer 604.1 but below any upper limit, such as a damage threshold, imposed by the most heat-sensitive component formed on the substrate. This temperature range is used in step 506 of the method described with reference to FIG. 5. LXT-VR layer 604.3 forms large crystallites with low-density grain boundaries 609.3D, MXT-VR layer 604.2 forms medium crystallites with dense grain boundaries 609.2C, and HXT-VR layer 604.1 forms small crystallites with high-density grain boundaries 609.1D. The duration of the annealing may need to be optimized for different host materials and dopants, but this is not expected to require undue experimentation.

Figure 7A:
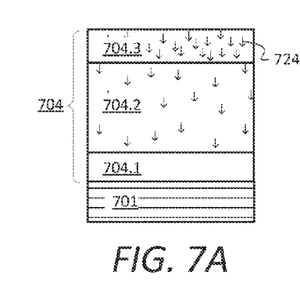
FIGS. 7A-C conceptually illustrate VR stacks with doping variants.
Figure 7B:
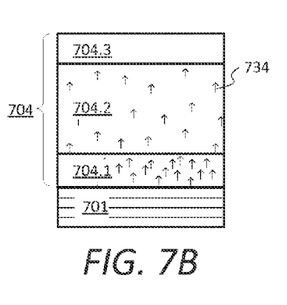
Figure 7C:
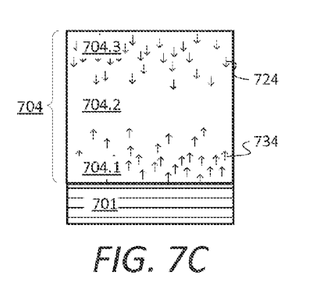

FIGS. 7A-C conceptually illustrate VR stacks with doping variants. For simplicity, only the VR layers are shown; substrate 701 may include underlying layers or structures. In FIG. 7A, LXT-VR layer 704.3 is relatively heavily doped with XT-decreasing dopant 724, MXT-VR layer 704.2 is relatively lightly doped with XT-decreasing dopant 724, and HXT-VR layer 604.1 is undoped. In FIG. 7B, LXT-VR layer 704.3 is undoped, MXT-VR layer 704.2 is relatively lightly doped with XT-increasing dopant 734, and HXT-VR layer 704.1 is relatively heavily doped with XT-increasing dopant 734. FIG. 7C illustrates a dopant gradient, where the transitions between differently doped layers are gradual. In this example, relatively heavy doping with XT-decreasing dopant 724 in LXT-VR layer 704.3 gradually becomes lighter doping and disappears near the undoped center of MXT-VR layer 704.2. In the lower part of MXT-VR layer 704.2, light doping with XT-increasing dopant 734 is introduced and increases to become relatively heavy doping in HXT-VR layer 704.1.

Figure 8A:
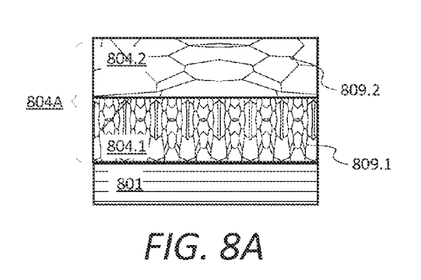
FIGS. 8A and 8B conceptually illustrate two-layer VR stack embodiments.
Figure 8B:
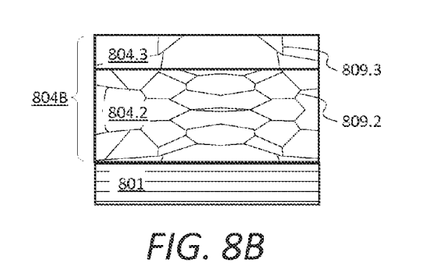

FIGS. 8A and 8B conceptually illustrate two-layer VR stack embodiments. These examples have two layers with different grain sizes instead or three, which also causes some tapering of the filament. The grains in the bi-layer may be any paired subset of small (e.g., 809.1), medium (e.g., 809.2) and large (e.g., 809.3). As with the three-layer embodiments, one layer may be doped and the other undoped, or both may be doped with different dopants or different concentrations of the same dopant. The relative layer thicknesses may be distributed in any convenient way; nearly equal as in stack 804A, or one layer significantly thicker than the other as in stack 804B.

Figure 9:
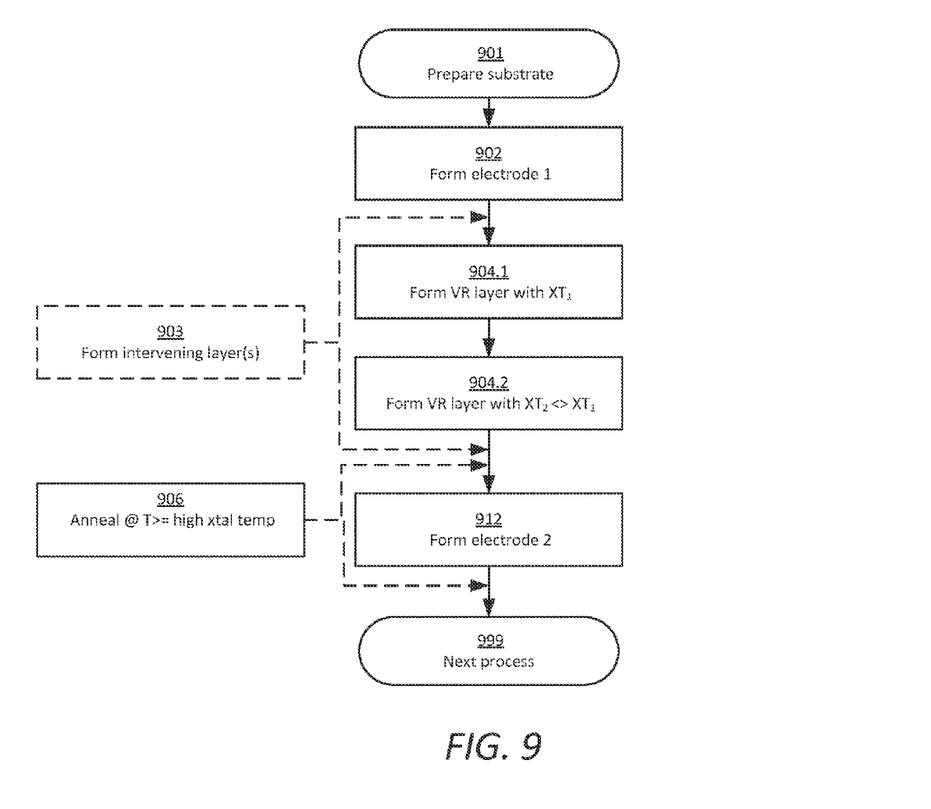
FIG. 9 is a flowchart of an example process for fabricating a ReRAM cell with two VR layers of different grain sizes.

FIG. 9 is a flowchart of an example process for fabricating a ReRAM cell with two VR layers of different grain sizes. Step 901 of preparing the substrate may include cleaning, degassing, other treatments, or the formation of layers and structures that precede those formed by this process. Step 902 of forming a first electrode over a substrate may include any suitable method for the selected material, which in some embodiments may include without limitation PVD, CVD, ALD, plasma-enhanced or UV-assisted variants of CVD or ALD, electrochemical deposition, electroless deposition, evaporation, or the like.

Step 904.1 of forming a VR layer with a first crystallization temperature $XT_1$ is followed by step 904.2 of forming another VR layer with a second crystallization temperature $XT_2$ that is different (either higher or lower) than XT1. In some embodiments, the order may be selected to position the VR layer with the higher crystallization temperature closest to a source electrode and the VR layer with the lower crystallization temperature closest to an inert or less-reactive electrode.

The two VR layers may be differently doped versions of the same host material. The host material may be, for example, a metal oxide, a metal nitride, or a metal oxynitride. One of the layers may be doped and one may be undoped, or both of the layers may be doped. For example, the first VR layer may be undoped and the second VR layer may be doped with an XT-decreasing dopant such as Hf, Ta, Ti or Zr, or alternatively with an XT-increasing dopant such as Si or N. Alternatively, the first VR layer may be doped with an XT-increasing dopant and the second VR layer may be more heavily doped with the XT-increasing dopant. As another alternative, the first VR layer may be doped with an XT-decreasing dopant and the second VR layer may be more heavily doped with the XT-decreasing dopant. Any variation of materials or dopants that result in two VR layers having different crystallization temperatures can be within the scope. The differently doped VR layers may have a discrete interface created by abruptly starting or stopping the doping, or a gradient interface created by gradually increasing or decreasing the dopant concentration.

In some embodiments, the doping may be combined with deposition of the host material by co-deposition methods such as co-sputtering (PVD) or mixing precursors (CVD or ALD). Alternatively, the doping may include pausing the deposition of the host material one or more times to deposit a thin layer (e.g., 3 nm thick) of dopant before continuing to deposit the host material. Annealing may be used to interdiffuse the dopant layers and host layers. As another alternative, the dopant(s) may be added by ion implantation after the host layers are partially or fully formed.

Step 912 of forming a second electrode follows the formation of the two VR layers 904.1 and 904.2. Step 906 of annealing the substrate at a temperature greater than or equal to the higher of $XT_1$ and $XT_2$ may be done either before or after the forming of the second electrode. Annealing 906 may continue for a sufficiently long duration to crystallize at least 30% of the VR layer with the higher crystallization temperature. Optional step 903 of forming an intervening layer (e.g., a barrier layer, an adhesion layer, a coupling layer, a current-limiting layer, or the like) may be inserted before or after the formation of the two VR layers 904.1 and 904.2. Afterward, next step 999 may commence.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A device, comprising:
a first layer formed over a substrate, the first layer operable as a first electrode;
a second layer formed over the first layer, the second layer operable as a second electrode; and
a variable-resistance stack formed between the first layer and the second layer;
wherein the variable-resistance stack comprises
a first variable-resistance layer;
a second variable-resistance layer formed over the first variable-resistance layer;
wherein the first variable-resistance layer has a first grain boundary density; and
wherein the second variable-resistance layer has a second grain boundary density different from the first grain boundary density; and
a third variable-resistance layer between the second variable-resistance layer and the second layer;
wherein the third variable-resistance layer has a third grain boundary density different from both the first grain boundary density and the second grain boundary density; and
wherein the second grain boundary density is between the first grain boundary density and the third grain boundary density.

2. The device of claim 1, wherein the first variable-resistance layer and the second variable-resistance layer comprise a same host material.

3. The device of claim 2, wherein one of the first variable-resistance layer or the second variable-resistance layer is an undoped layer of the same host material.

4. The device of claim 1, wherein the first variable-resistance layer or the second variable-resistance layer comprises one of hafnium, tantalum, titanium, zirconium, silicon, or nitrogen.

5. The device of claim 1, wherein the first layer or the second layer is operable as a source electrode; and wherein the one of the first variable-resistance layer or the second variable-resistance layer having a highest grain density is nearer to the source electrode than the other one of the first variable-resistance layer or the second variable-resistance layer.

6. The device of claim 1, wherein the variable-resistance stack comprises at least two doped layers.

7. The device of claim 6, wherein the at least two doped layers comprise different dopants.

8. The device of claim 6, wherein the at least two doped layers comprise different concentrations of a same dopant.

9. The device of claim 1, wherein the second variable-resistance layer is undoped.

* * * * *